US010005672B2

(12) United States Patent
Mazyar et al.

(10) Patent No.: US 10,005,672 B2
(45) Date of Patent: *Jun. 26, 2018

(54) METHOD OF FORMING PARTICLES COMPRISING CARBON AND ARTICLES THEREFROM

(75) Inventors: Oleg A. Mazyar, Katy, TX (US); Soma Chakraborty, Houston, TX (US); Oleksandr V. Kuznetsov, Sugar Land, TX (US); Anthony A. DiGiovanni, Houston, TX (US); Gaurav Agrawal, Aurora, CO (US); Michael H. Johnson, Katy, TX (US)

(73) Assignee: Baker Hughes, a GE company, LLC, Houston, TX (US)

( * ) Notice: Subject to any disclaimer, the term of this patent is extended or adjusted under 35 U.S.C. 154(b) by 84 days.

This patent is subject to a terminal disclaimer.

(21) Appl. No.: 13/316,094

(22) Filed: Dec. 9, 2011

(65) Prior Publication Data
US 2013/0149447 A1    Jun. 13, 2013
US 2016/0185606 A9   Jun. 30, 2016

(51) Int. Cl.
*C23C 16/26* (2006.01)
*B82Y 30/00* (2011.01)
*B82Y 40/00* (2011.01)
*C23C 16/44* (2006.01)
*C01B 31/02* (2006.01)
*B01J 3/06* (2006.01)
*C01B 31/06* (2006.01)
*C01B 32/05* (2017.01)
*C01B 32/25* (2017.01)
*C01B 32/28* (2017.01)

(52) U.S. Cl.
CPC .......... *C01B 31/065* (2013.01); *C01B 32/05* (2017.08); *C01B 32/25* (2017.08); *C01B 32/28* (2017.08); *C23C 16/26* (2013.01); *C23C 16/4417* (2013.01); *B01J 2203/062* (2013.01); *B01J 2203/0655* (2013.01); *B82Y 30/00* (2013.01); *B82Y 40/00* (2013.01); *C01P 2004/51* (2013.01); *C01P 2004/60* (2013.01)

(58) Field of Classification Search
None
See application file for complete search history.

(56) References Cited

U.S. PATENT DOCUMENTS

| | | |
|---|---|---|
| 3,371,996 A | 3/1968 | Hibshman |
| 3,663,475 A | 5/1972 | Figel |
| 3,709,826 A | 1/1973 | Pitt et al. |
| 3,745,623 A | 7/1973 | Wentorf et al. |
| 4,148,368 A | 4/1979 | Evans |
| 4,224,380 A | 9/1980 | Bovenkerk et al. |
| 4,242,106 A | 12/1980 | Morelock |
| 4,311,490 A | 1/1982 | Bovenkerk et al. |
| 4,412,980 A | 11/1983 | Tsuji et al. |
| 4,483,836 A | 11/1984 | Adadurov et al. |
| 4,525,179 A | 6/1985 | Gigl |
| 4,592,433 A | 6/1986 | Dennis |
| 4,604,106 A | 8/1986 | Hall et al. |
| 4,605,343 A | 8/1986 | Hibbs, Jr. et al. |
| 4,636,253 A | 1/1987 | Nakai et al. |
| 4,664,705 A | 5/1987 | Horton et al. |
| 4,694,918 A | 9/1987 | Hall |
| 4,710,483 A | 12/1987 | Burk et al. |
| 4,726,718 A | 2/1988 | Meskin et al. |
| 4,784,023 A | 11/1988 | Dennis |
| 4,797,241 A | 1/1989 | Peterson et al. |
| 4,861,350 A | 8/1989 | Phaal et al. |
| 4,866,885 A | 9/1989 | Dodsworth |
| 4,903,164 A | 2/1990 | Bishop et al. |
| 4,940,180 A | 7/1990 | Martell |
| 4,944,772 A | 7/1990 | Cho |
| 4,976,324 A | 12/1990 | Tibbitts |
| 5,011,514 A | 4/1991 | Cho et al. |
| 5,027,912 A | 7/1991 | Juergens |
| 5,127,923 A | 7/1992 | Bunting et al. |
| 5,217,081 A | 6/1993 | Waldenstrom et al. |
| 5,417,953 A * | 5/1995 | Cappelli ........... B01J 3/008 423/446 |
| 5,443,337 A | 8/1995 | Katayama |

(Continued)

FOREIGN PATENT DOCUMENTS

| | | |
|---|---|---|
| CN | 1279729 A | 1/2001 |
| CN | 1643183 A | 7/2005 |

(Continued)

OTHER PUBLICATIONS

Zhang et al.; Conversion of Nickel Coated Carbon Nanotubes to Diamond under High Pressure and High Temperature; Jpn. J. Appl. Phys. vol. 37; pp. L1085-L1086; 1987.*
Butler et al.; Controlled Synthesis of High Quality Micro/Nanodiamonds by Microwave Plasma Chemical Vapor Deposition; Diamond & Related Materials; 18, pp. 51-55; published online Sep. 30, 2008.*
DiGiovanni et al., U.S. Appl. No. 61/535,475, entitled, Functionalized Carbon-Free Particles for Improved Sintering of Polycrystalline Diamond, filed Sep. 16, 2011.
DiGiovanni, U.S. Appl. No. 61/535,470, entitled, Use of Hydrocarbon Gases to Promote Diamond Intergrowth in Polycrystalline Diamond Material, filed Sep. 16, 2011.
Mahdavian et al., Nanocomposite Particles with Core-Shell Morphology III: Preparation and Characterization of Nano Al2O3-Poly(styrene-methyl Methacrylate) Particles Via Miniemulsion Polymerization, Polym. Bull. (2009) vol. 63, pp. 329-340.

(Continued)

*Primary Examiner* — Guinever S Gregorio
(74) *Attorney, Agent, or Firm* — TraskBritt

(57) ABSTRACT

A method of growing carbonaceous particles comprises depositing carbon from a carbon source, onto a particle nucleus, the particle nucleus being a carbon-containing material, an inorganic material, or a combination comprising at least one of the foregoing, and the carbon source comprising a saturated or unsaturated compound of $C_{20}$ or less, the carbonaceous particles having a uniform particle size and particle size distribution. The method is useful for preparing polycrystalline diamond compacts (PDCs) by a high-pressure, high-temperature (HPHT) process.

15 Claims, No Drawings

(56) References Cited

U.S. PATENT DOCUMENTS

| | | | |
|---|---|---|---|
| 5,472,376 A | 12/1995 | Olmstead et al. | |
| 5,533,582 A | 7/1996 | Tibbitts | |
| 5,540,904 A | 7/1996 | Bovenkerk et al. | |
| 5,645,617 A | 7/1997 | Frushour | |
| 5,662,183 A | 9/1997 | Fang | |
| 5,667,028 A | 9/1997 | Truax et al. | |
| 5,685,769 A | 11/1997 | Adia et al. | |
| 5,722,499 A | 3/1998 | Nguyen et al. | |
| 5,807,433 A * | 9/1998 | Poncelet et al. | 117/89 |
| 5,965,267 A | 10/1999 | Nolan et al. | |
| 5,979,577 A | 11/1999 | Fielder | |
| 5,979,578 A | 11/1999 | Packer | |
| 5,980,982 A * | 11/1999 | Degawa | B01J 3/062 |
| | | | 423/446 |
| 6,009,963 A | 1/2000 | Chaves et al. | |
| 6,045,440 A | 4/2000 | Johnson et al. | |
| 6,148,937 A | 11/2000 | Mensa-Wilmot et al. | |
| 6,149,695 A | 11/2000 | Adia et al. | |
| 6,187,068 B1 | 2/2001 | Frushour et al. | |
| 6,214,079 B1 | 4/2001 | Kear et al. | |
| 6,220,375 B1 | 4/2001 | Butcher et al. | |
| 6,261,532 B1 | 7/2001 | Ono | |
| 6,302,405 B1 | 10/2001 | Edwards | |
| 6,325,165 B1 | 12/2001 | Eyre | |
| 6,344,149 B1 | 2/2002 | Oles | |
| 6,350,488 B1 | 2/2002 | Lee | |
| 6,361,873 B1 | 3/2002 | Yong et al. | |
| 6,377,387 B1 | 4/2002 | Duthaler et al. | |
| 6,533,644 B1 | 3/2003 | Horie et al. | |
| 6,544,599 B1 | 4/2003 | Brown et al. | |
| 6,655,234 B2 | 12/2003 | Scott | |
| 6,655,845 B1 * | 12/2003 | Pope | A61F 2/30767 |
| | | | 384/491 |
| 6,719,074 B2 | 4/2004 | Tsuda et al. | |
| 6,951,578 B1 | 10/2005 | Belnap et al. | |
| 6,991,049 B2 | 1/2006 | Eyre et al. | |
| 7,070,635 B2 | 7/2006 | Frushour | |
| 7,074,247 B2 | 7/2006 | Tank et al. | |
| 7,147,687 B2 | 12/2006 | Mirkin et al. | |
| 7,224,039 B1 | 5/2007 | McGuire et al. | |
| 7,235,296 B2 | 6/2007 | Hunt et al. | |
| 7,348,298 B2 | 3/2008 | Zhang et al. | |
| 7,419,941 B2 | 9/2008 | Waynick | |
| 7,435,296 B1 | 10/2008 | Sung | |
| 7,449,432 B2 | 11/2008 | Lockwood et al. | |
| 7,493,973 B2 | 2/2009 | Keshavan et al. | |
| 7,516,804 B2 | 4/2009 | Vail | |
| 7,572,332 B2 | 8/2009 | Gruen | |
| 7,585,342 B2 | 9/2009 | Cho | |
| 7,628,234 B2 | 12/2009 | Middlemiss | |
| 7,635,035 B1 | 12/2009 | Bertagnolli et al. | |
| 7,647,992 B2 | 1/2010 | Fang et al. | |
| 7,690,589 B2 | 4/2010 | Kerns | |
| 7,794,690 B2 | 9/2010 | Abatzoglou et al. | |
| 7,972,397 B2 | 7/2011 | Vail | |
| 8,080,071 B1 * | 12/2011 | Vail | E21B 10/5735 |
| | | | 175/434 |
| 8,083,012 B2 | 12/2011 | Voronin et al. | |
| 8,118,896 B2 | 2/2012 | Can et al. | |
| 8,147,790 B1 | 4/2012 | Vail et al. | |
| 8,911,521 B1 * | 12/2014 | Miess | C04B 35/52 |
| | | | 51/293 |
| 8,974,562 B2 | 3/2015 | Chakraborty et al. | |
| 8,985,248 B2 | 3/2015 | DiGiovanni et al. | |
| 2003/0175498 A1 | 9/2003 | Hunt et al. | |
| 2003/0191533 A1 | 10/2003 | Dixon et al. | |
| 2004/0022861 A1 | 2/2004 | Williams et al. | |
| 2004/0037948 A1 | 2/2004 | Tank et al. | |
| 2004/0060243 A1 | 4/2004 | Fries et al. | |
| 2004/0118762 A1 | 6/2004 | Xu et al. | |
| 2004/0121070 A1 | 6/2004 | Xu et al. | |
| 2005/0002851 A1 | 1/2005 | McElrath et al. | |
| 2005/0019114 A1 | 1/2005 | Sung | |
| 2005/0074392 A1 | 4/2005 | Yang et al. | |
| 2005/0136667 A1 | 6/2005 | Sung | |
| 2005/0139397 A1 | 6/2005 | Achilles et al. | |
| 2005/0158549 A1 | 7/2005 | Khabashesku et al. | |
| 2005/0159634 A1 | 7/2005 | Dahl et al. | |
| 2005/0161212 A1 | 7/2005 | Leismer | |
| 2006/0113546 A1 | 6/2006 | Sung | |
| 2006/0166615 A1 | 7/2006 | Tank et al. | |
| 2007/0036896 A1 | 2/2007 | Sung et al. | |
| 2007/0102199 A1 | 5/2007 | Smith et al. | |
| 2007/0187153 A1 | 8/2007 | Bertagnolli | |
| 2007/0253886 A1 | 11/2007 | Abatzoglou et al. | |
| 2007/0254560 A1 | 11/2007 | Woo et al. | |
| 2008/0023230 A1 | 1/2008 | Cho | |
| 2008/0023231 A1 | 1/2008 | Vail | |
| 2008/0127475 A1 | 6/2008 | Griffo | |
| 2008/0142267 A1 | 6/2008 | Griffin et al. | |
| 2008/0168717 A1 | 7/2008 | Can et al. | |
| 2008/0179109 A1 | 7/2008 | Belnap et al. | |
| 2008/0206576 A1 | 8/2008 | Qian et al. | |
| 2008/0209818 A1 | 9/2008 | Belnap et al. | |
| 2008/0305028 A1 | 12/2008 | McKeigue et al. | |
| 2009/0022952 A1 | 1/2009 | Keshavan | |
| 2009/0022969 A1 | 1/2009 | Zhang et al. | |
| 2009/0042166 A1 | 2/2009 | Craig et al. | |
| 2009/0090918 A1 | 4/2009 | Hobart et al. | |
| 2009/0127565 A1 | 5/2009 | Sung | |
| 2009/0158670 A1 | 6/2009 | Vail | |
| 2009/0178345 A1 | 7/2009 | Russell et al. | |
| 2009/0218146 A1 | 9/2009 | Fang et al. | |
| 2009/0218276 A1 | 9/2009 | Linford et al. | |
| 2009/0218287 A1 | 9/2009 | Vail et al. | |
| 2009/0221773 A1 | 9/2009 | Linford et al. | |
| 2009/0257942 A1 | 10/2009 | Sung | |
| 2009/0277839 A1 | 11/2009 | Linford | |
| 2009/0286352 A1 | 11/2009 | Sung | |
| 2009/0313908 A1 | 12/2009 | Zhang et al. | |
| 2010/0012389 A1 | 1/2010 | Zhang et al. | |
| 2010/0041315 A1 | 2/2010 | Sung | |
| 2010/0068503 A1 | 3/2010 | Neogi et al. | |
| 2010/0069567 A1 | 3/2010 | Petrov et al. | |
| 2010/0129615 A1 | 5/2010 | Chizik et al. | |
| 2010/0187925 A1 | 7/2010 | Tingler et al. | |
| 2010/0209665 A1 | 8/2010 | Konovalov et al. | |
| 2010/0227134 A1 | 9/2010 | Shah et al. | |
| 2011/0031034 A1 | 2/2011 | DiGiovanni et al. | |
| 2011/0042147 A1 | 2/2011 | Fang | |
| 2011/0059876 A1 | 3/2011 | Takahama et al. | |
| 2011/0088954 A1 | 4/2011 | DiGiovanni | |
| 2011/0252711 A1 | 10/2011 | Chakraborty et al. | |
| 2011/0252712 A1 | 10/2011 | Chakraborty et al. | |
| 2011/0252713 A1 | 10/2011 | Chakraborty et al. | |
| 2012/0003479 A1 | 1/2012 | Hsin et al. | |
| 2012/0034150 A1 | 2/2012 | Noyes | |
| 2012/0034464 A1 | 2/2012 | Chakraborty et al. | |
| 2012/0037431 A1 | 2/2012 | DiGiovanni et al. | |
| 2013/0068540 A1 | 3/2013 | DiGiovanni | |
| 2013/0068541 A1 | 3/2013 | DiGiovanni et al. | |
| 2015/0143755 A1 | 5/2015 | Chakraborty et al. | |

FOREIGN PATENT DOCUMENTS

| | | | |
|---|---|---|---|
| CN | 1763267 A | 4/2006 | |
| CN | 1954042 A | 4/2007 | |
| DE | 102011050112 A1 * | 11/2011 | B22F 1/02 |
| EP | 604211 | 6/1994 | |
| EP | 659510 B1 | 6/1995 | |
| EP | 0343846 B1 | 4/1996 | |
| EP | 941791 A2 | 9/1999 | |
| EP | 1321545 A1 | 6/2003 | |
| EP | 1330323 B1 | 5/2006 | |
| EP | 2105256 A1 | 9/2009 | |
| EP | 2147903 A2 | 1/2010 | |
| EP | 2431327 A1 | 3/2012 | |
| JP | 01-103990 A | 4/1989 | |
| JP | 04-317497 A | 11/1992 | |
| JP | 05-132394 A | 5/1993 | |
| JP | 09201525 A | 8/1997 | |
| JP | 2007-002278 A | 1/2007 | |
| JP | 2008115303 A | 5/2008 | |
| JP | 2009-091234 A | 4/2009 | |

(56) References Cited

FOREIGN PATENT DOCUMENTS

| | | | |
|---|---|---|---|
| JP | 2009091234 A * | 4/2009 | |
| WO | 0038864 A1 | 7/2000 | |
| WO | 0234437 A2 | 5/2002 | |
| WO | 02034437 A3 | 5/2002 | |
| WO | 2006032984 A2 | 3/2006 | |
| WO | 2006061672 A1 | 6/2006 | |
| WO | WO 2007041381 A1 * | 4/2007 | |
| WO | 2008014003 A2 | 1/2008 | |
| WO | 2008092093 A2 | 7/2008 | |
| WO | 2008094190 A2 | 8/2008 | |
| WO | 2008130431 A2 | 10/2008 | |
| WO | 2009048268 A2 | 4/2009 | |
| WO | 2009118381 A2 | 10/2009 | |
| WO | 2009147629 A1 | 12/2009 | |
| WO | 2010045257 A1 | 4/2010 | |
| WO | 2010062419 A2 | 6/2010 | |
| WO | 2010124625 A1 | 11/2010 | |
| WO | 2011046838 A1 | 4/2011 | |
| WO | 2011130516 A2 | 10/2011 | |

OTHER PUBLICATIONS

Koizumi et al., Physics and Applications of CVD Diamond, Wiley—VCH Verlag GmbH & Co. KGaA, 2008, ISB: 978-3-527-40801-6, 55 pages.

PCT International Search Report for PCT Application No. PCT/2012/068372, mailed Mar. 21, 2013.

Schlange, et al., "Continuous preparation of carbon-nanotube-supported platinum catalysts in a flow reactor directly heated by electric current," Beilstein J. of Organic Chem. 2011, 7, 1412-1420.

Chein et al., "Synthesis of diamond in high power-density microwave methane/hydrogen/oxygen plasmas at elevated substrate temperatures," Diamond and Related Materials 8 (1999), 1686-1696.

C.N.R. Rao et al., "Synthesis of multi-walled and single-walled nanotubes, aligned-nanotube bundles and nanorods by employing organometallic precursors," Mater Res Innovat (1998) 2, pp. 128-141.

L S Panchakarla et al., "Carbon nanostructures and graphite-coated metal nanostructures obtained by pyrolysis of ruthenocene and ruthenocene-ferrocene mixtures," Bull. Mater. Sci., vol. 30, No. 1, Feb. 2007, pp. 23-29.

L. R. Martin, "High-quality diamonds from an acetylene mechanism," Journal of Materials Science Letters 12 (1993), pp. 246-248.

Mark A. Cappelli et al., "In-situ mass sampling during supersonic arcject synthesis of diamond," Diamond and Related Materials, 3 (1994), pp. 417-421.

Seiichiro Matsumoto et al., "Vapor Deposition of Diamond Particles from Methane," Japanese Journal of Applied Physics, vol. 21, No. 4, Apr. 1982, pp. L183-L185.

W.A. Yarbrough et al., "Diamond growth with locally supplied methane and acetylene," J. Mater. Res., vol. 7, No. 2, Feb. 1992, pp. 379-383.

Atwater et al., Accelerated growth of carbon nanofibers using physical mixtures and alloys of Pd and Co in an ethylene-hydrogen environment, Carbon 49 (2011) pp. 1058-1066.

Homma et al., Single-Walled Carbon Nanotube Growth with Non-Iron-Group "Catalysts" by Chemical Vapor Deposition, Nano Res (2009) 2: pp. 793-799.

Sen et al., Carbon nanotubes by the metallocene route, Chemical Physics Letters 267 (1997) pp. 276-280.

Yang et al., Morphology and microstructure of spring-like carbon micro-coils/nano-coils prepared by catalytic pyrolysis of acetylene using Fe-containing alloy catalysts, Carbon 43 (2005) pp. 827-834.

Yu et al., Catalytic synthesis of carbon nanofibers and nanotubes by the pyrolysis of acetylene with iron nanoparticles prepared using a hydrogen-arc plasma method, Materials Letters 63 (2009) pp. 1677-1679.

International Preliminary Report on Patentability and Written Opinion for International Application No. PCT/US2012/068372, Issued Jun. 10, 2014.

Pohanish, Richard P., (2012). Sittig's Handbook of Toxic and Hazardous Chemicals and Carcinogens (6th Edition)—Paraffin Wax. Elsevier. Online version available at: http://app.knovel.com/hotlink/pdf/id:kt0094M12G/sittigs-handbook-toxic-3/paraffin-wax).

European Search Report for European Application No. 12854942.5 dated Jun. 17, 2015, 15 pages.

Cleveland et al., Raman Spectrum of 1-Bromo-Dodecane, Journal of Chemical Physics, (1940), vol. 8, pp. 867-868.

Saini et al., Core-Shell Diamond as a Support for Solid-Phase Extraction and High-Performance Liquid Chromatography, Anal. Chem., (2010), vol. 82, No. 11, pp. 4448-4456.

Chinese Office Action and Search Report for Chinese Application No. 201280066620.4, dated May 4, 2016, 21 pages with English translation.

Liu et al., "Functionalization of Carbon Nano-Onions by Direct Fluorinations" Chem. Mater. vol. 19, No. 4 (2007) pp. 778-786.

Moore et al., Individually Suspended Single-Walled Carbon Nanotubes in Various Surfactants, American Chemical Society, Nano Leters, vol. 3, No. 10, 2003, pp. 1379-1382.

"Hydrogen-terminated diamond surfaces and interfaces" Hiroshi Kawarada Surface Science Reports 26 (1996) 205-259. Available online Feb. 11, 1999. http://dx.doi.org/10.1016/S0167-5729(97)80002-7.

"Clathrate hydrates" Peter Englezos Industrial & Engineering Chemistry Research 1993 32 (7), 1251-1274. DOI: 10.1021/ie00019a001.

Kruger; Diamond Nanoparticles: Jewels for Chemistry and Physics; Ad. Mater.; 20, 2445-2449; 2008.

Chinese Second Office Action for Chinese Application No. 201280066620.4 dated Dec. 23, 2016, 12 pages.

Chinese Rejection Decision for Chinese Application No. 201280066620.4 dated Apr. 7, 2017, 11 pages.

Delmas M et al: "Long and aligned multi-walled carbon nanotubes grown on carbon and metallic substrates by injection-CVD process", ECS Transactions, Electrochemical Society, US, vol. 25, No. 8, Jan. 1, 2009 (Jan. 1, 2009), pp. 757-762, XP008131461, ISSN: 1938-5862, DOI: 1149/1.3207664.

European Office Action for European Patent Application No. 12854942.5 dated Jun. 23, 2017, 4 pages.

* cited by examiner

METHOD OF FORMING PARTICLES COMPRISING CARBON AND ARTICLES THEREFROM

CROSS-REFERENCE TO RELATED APPLICATIONS

This application is a continuation-in-part of U.S. Appl. No. 13/084,003, filed Apr. 11, 2011, now U.S. Pat. No. 8,974,562, issued Mar. 10, 2015, which is a continuation-in-part of U.S. Appl. No. 13/077,426, filed Mar. 31, 2011, which claims benefit of U.S. Provisional Patent Appl. No. 61/324,142, filed Apr. 14, 2010.

BACKGROUND

The application of carbonaceous particles to the construction and implementation of articles for use in downhole tooling can significantly improve their mechanical, thermal, and/or electrical performance. For example, diamond as a carbonaceous particle is known to have an extremely high degree of hardness, abrasiveness, and thermal conductivity.

Specifically, polycrystalline diamond compacts (PDCs) formed of small (e.g., nano- and/or micron-sized) diamond grains (i.e., carbonaceous particles) fused and bonded together by a high temperature, high pressure process using a metal catalyst, and supported on a ceramic substrate, can be incorporated onto a drill bit. Such drill bits have been found to provide a superabrasive abrasive surface, which is capable of cutting through hard rock for extended periods of time, and under severe down-hole conditions of temperature, pressure, and corrosive down-hole environments, while maintaining the integrity and performance of the drill bit.

The beneficial effects of such carbonaceous particles strongly depends on their size and composition, however. Therefore, it can be important to control effectively the synthesis of carbonaceous particles and, thus, to have the ability to produce particles of known and controllable sizes and their finely tuned mixtures.

SUMMARY

The above and other deficiencies of the prior art are overcome by a method of growing carbonaceous particles, comprising depositing carbon from a carbon source, onto a particle nucleus, the particle nucleus being a carbon-containing material, an inorganic material, or a combination comprising at least one of the foregoing, and the carbon source comprising a saturated or unsaturated compound of $C_{20}$ or less, the carbonaceous particles having a uniform particle size and particle size distribution.

In another embodiment, a method of forming an article comprises depositing carbon from a carbon source, onto a particle nucleus comprising a carbon-containing material, an inorganic material, or a combination comprising at least one of the foregoing, the carbon source comprising a saturated or unsaturated $C_{1-4}$ compound, and forming an article from the particle formed by depositing carbon onto the particle nucleus, by casting, heating, pressurizing, molding, or a combination comprising at least one of the foregoing steps, the particle so formed by treating having a uniform particle size and particle size distribution.

In another embodiment, a method of forming a polycrystalline diamond compact comprises heating and pressure treating, in the presence of a metal catalyst, a diamond table comprising nanodiamonds, microdiamonds, or a combination comprising at least one of the foregoing, the nanodiamonds and/or microdiamonds being formed by depositing carbon from a carbon source onto a particle nucleus comprising a carbon-containing material, an inorganic material, or a combination comprising at least one of the foregoing, the carbon source comprising a saturated or unsaturated compound of $C_{20}$ or less, the nanodiamonds and/or microdiamonds so formed by depositing having a uniform particle size and particle size distribution.

DETAILED DESCRIPTION

Disclosed herein is a method of growing carbonaceous particles, including depositing carbon from a carbon source onto a particle nucleus, under conditions in which the carbon builds a uniform structural basis of the carbonaceous particle. In this way, diamond, graphitic structures, diamond-like carbon, fibers, coils, and the like are formed on the nucleus to provide the nanoparticles. The carbonaceous particles grown by the method have uniform particle sizes and uniform particle size distributions. As used herein, "uniform particle size" means where the distribution of particle sizes varies by less than or equal to 10%, or in an embodiment, less than or equal to 5%, or in another embodiment, less than or equal to 1%, based on either number average particle size measured according to the longest dimension of the particle, or particle size by volume. Also as used herein, "particle size distribution" means the distribution of particle sizes resulting from the growth process, where the particle size distribution obtained is consistent, e.g., a log normal, Weibull, Gaussian, etc., distribution and is unimodal, bimodal, or multimodal based on the nucleating and growth conditions. Growth is accomplished by chemical vapor deposition, or by pyrolysis, or a combination of these techniques. By using a carbon source, such as a low molecular weight carbon-based substance, such as methane, ethane, or acetylene, or an organometallic compound, such as a metallocene that can decompose to form volatile precursors for particle growth, the resulting particles can be formed in a controlled manner, with consistent uniform particle sizes and particle size distributions.

In an embodiment, a method of growing carbonaceous particles comprises depositing carbon from a carbon source onto a particle nucleus. The carbon adds to the surface of the nucleus and to previous layers during deposition, and builds up to form the carbonaceous particle, affording a uniform structure having at least one type of structural feature. The carbonaceous coating has, in this way, $sp^2$ and/or $sp^3$ carbon structures, such as a graphitic structure including graphite, graphene, fullerene, or nanotube structure, diamond structure, amorphous carbon structure, or a combination comprising at least one of the foregoing structures. Carbonaceous particles grown in this way have regular or irregular shapes including a spherical shape, a spheroidal shape, a worm-like carbon structure, a nanofiber shape, a nano- and/or micro-coil shape, or a combination comprising at least one of the foregoing.

The particle nucleus is a carbon-containing material, an inorganic material, or a combination comprising at least one of the foregoing. Carbon-containing materials useful as a particle nucleus include diamond, diamond-like carbon, carbon black, graphite, graphene, nanotubes, or a combination comprising at least one of the foregoing.

Graphene, sometimes referred to herein as "nanographene," includes both graphene having an average largest dimension of greater than or equal to 1 µm, and nanographene having an average largest dimension of less than 1 µm. Graphenes, including nanographene, are effectively two-dimensional, having a stacked structure of one or more layers of fused hexagonal rings, layered and weakly bonded to one another through π-π stacking interaction. In an exemplary embodiment, graphene has an average particle size of 1 μm to 5 μm, and specifically 2 μm to 4 μm. Graphenes have an average smallest particle size (smallest average dimension, i.e., thickness) of less than or equal to about 50 nm, more specifically less than or equal to about 10 nm, and still more specifically less than or equal to 5 nm. Graphene (including nanographene) has less than about 50 single sheet layers, specifically less than about 10 single sheet layers, and more specifically less than or equal to about 5 single sheet layers, or is as little as a single sheet thick.

Fullerenes, as disclosed herein, include any of the known cage-like hollow allotropic forms of carbon possessing a polyhedral structure. Fullerenes include, for example, from about 20 to about 100 carbon atoms. For example, $C_{60}$ is a fullerene having 60 carbon atoms and high symmetry ($D_{5h}$), and is a relatively common, commercially available fullerene. Exemplary fullerenes include $C_{30}$, $C_{32}$, $C_{34}$, $C_{38}$, $C_{40}$, $C_{42}$, $C_{44}$, $C_{46}$, $C_{48}$, $C_{50}$, $C_{52}$, $C_{60}$, $C_{70}$, $C_{76}$, and the like.

Nanotubes include carbon nanotubes, inorganic nanotubes, metallated nanotubes, or a combination comprising at least one of the foregoing. Nanotubes are tubular structures having open or closed ends and that are inorganic (e.g., boron nitride) or made entirely or partially of carbon. In an embodiment, carbon and inorganic nanotubes include additional components, such as metals or metalloids, that are incorporated into the structure of the nanotube, included as a dopant, form a surface coating, or a combination comprising at least one of the foregoing. Nanotubes, including carbon nanotubes and inorganic nanotubes, are single-walled nanotubes (SWNTs) or multi-walled nanotubes (MWNTs).

Diamonds include microdiamonds and nanodiamonds. Microdiamonds are diamond particles having an average particle size of greater than or equal to about one micrometer. Nanodiamonds are diamond particles having an average particle size of less than about one micrometer (μm). The microdiamonds and nanodiamonds are from a naturally occurring source, such as a by-product of milling or other processing of natural diamonds, or are synthetic, prepared by any suitable commercial method.

Inorganic particles include metals, a metal or metalloid carbide such as tungsten carbide, silicon carbide, boron carbide, or the like; a metal or metalloid nitride such as titanium nitride, boron nitride, silicon nitride, or the like; a metal or metalloid oxide such as titanium oxide, alumina, silica, tungsten oxide, iron oxides, combinations thereof, or the like; or a combination comprising at least one of the foregoing. In an embodiment, the metal comprises particles of a metal, metal alloy, physical mixtures of metal particles, and combinations comprising at least one of the foregoing. Exemplary metals include cobalt, molybdenum, iron, platinum, palladium, gold, silver, copper, ruthenium, mixtures thereof, alloys thereof, and the like. Exemplary inorganic particles include silica, silicon, germanium, and silicon carbide, combinations thereof, and the like.

The carbonaceous particles are formed from the growth of carbon structures on the particle nuclei, and have the same or different composition and/or structure as the nuclei, depending on the type of deposition of carbon and carbon source.

The carbon source is any compound useful for forming a carbonaceous vapor precursor material, that can deposit uniformly and undergo a reaction to form either unsaturated (sp or $sp^2$) or tetrahedral ($sp^3$) carbon features. In an embodiment, the carbon source comprises a saturated or unsaturated carbon-containing molecule of $C_{20}$ or less. In another embodiment, the carbon source comprises a saturated or unsaturated $C_{1-4}$ carbon molecule. Exemplary such carbon source molecules include methane, ethylene, acetylene, or a combination comprising at least one of the foregoing compounds.

In another embodiment, the carbon source comprises an organometallic complex. Useful organometallic complexes include metallocenes, such as ferrocenes, cobaltocene, nickelocene, ruthenocene, combinations comprising at least one of the foregoing, and the like.

In an embodiment, depositing is further carried out in the presence of hydrogen, an inert gas, or a combination comprising the foregoing.

Any method useful for forming a carbonaceous layer or outer shell of a particle is contemplated as useful herein. In an embodiment, the carbonaceous layer of a carbonaceous particle is formed by deposition of carbon species from the carbon source. Depositing comprises chemical vapor deposition, pyrolysis, or a combination comprising at least one of the foregoing. Other methods of deposition are also useful, such as physical vapor deposition (PVD).

In an embodiment, diamond is formed by the depositing. For example, growth of high quality diamond was observed in microwave and radio frequency plasmas, hot filament and UV-assisted deposition using a variety of hydrocarbons as starting materials (D. V. Fedoseev, B. V. Derjaguin, I. G. Varshayskaya, and A. S. Semenova-Tyan-Shanskaya, *Crystallization of Diamond*, Nauka: Moscow, 1984 (in Russian); S. Matsumoto, Y. Sato, M. Kamo, and N. Setaka, *Jpn. J. Appl. Phys.* 1982, vol. 21, L183; and W. A. Yarbrough, K. Tankala, and T. DebRoy, *J. Mater. Res.*, 1992, vol. 7, No. 2, p. 379). High quality diamond can be grown from acetylene as a sole hydrocarbon source and with a rate comparable to that obtained by the use of methane (M. A. Cappelli, and M. H. Loh, "In-situ mass sampling during supersonic arcjet synthesis of diamond," *Diamond and Related Materials*, 3 (1994), pp. 417-421; L. R. Martin, *J. Mater. Sci. Lett.* 1993, vol. 12, p. 246). Carbon nanotubes growth has been found by Homma et al. (Y. Homma, H. Liu, D. Takagi, and Y. Kobayashi, *Nano Res.* 2009, vol. 2, pp. 793-799) to be catalyzed by not only metals including Pd, Pt, Au, Ag, and Cu, but also semiconductors such as Si, Ge, and SiC during chemical vapor deposition (CVD) processing, upon formation of nanoparticles of these catalytic materials.

Pyrolytic decomposition of organometallic compounds can also be used. For example, Rao et al. (C. N. R. Rao, A. Govindaraj, R. Sen, and B. C. Satishkumar, *Mater. Res. Innovat.* 1998, vol. 2, p. 128) show pyrolysis of metallocenes such as ferrocene, cobaltocene and nickelocene in the presence or absence of added hydrocarbons to yield carbon nanotubes without need for any external metal catalyst. L. S. Panchakarla and A. Govindaraj (*Bull. Mater. Sci.*, 2007, vol. 30, No. 1, pp. 23-29) disclose that pyrolysis of ruthenocene, as well as mixtures of ruthenocene and ethylene in hydrogen, gives rise to connected spherical nanoparticles and worm-like carbon structures, which contain a high proportion of $sp^3$ carbon.

Metal or metal alloy particles are also useful as catalytic centers for growth of carbonaceous material particles. For example, Atwater et al. (*Carbon*, 2011, vol. 49(4), pp. 1058-1066) disclose accelerated growth of carbon nanofibers using physical mixtures and alloys of Pd and Co micrometer-scale particles in an ethylene-hydrogen environment. Yu et al. (*Materials Letters* 2009, vol. 63(20), pp. 1677-1679) demonstrated production of carbon nanofibers and nanotubes by the catalytic pyrolysis of acetylene with iron nanoparticles prepared using a hydrogen-arc plasma method, in which the carbon nanofibers grow along a single dimension with the nucleating iron nanoparticle at one end of the nanofiber, and hence particle size control along the diameter is directly related to the diameter of the iron nanoparticle. Yang et al. (*Carbon* 2005, vol. 43(4), pp. 827-834) synthesized spring-like carbon micro-coils/nanocoils by catalytic pyrolysis of acetylene using Fe-containing alloy catalysts. Sen et al. (*Chemical Physics Letters,* 1997, vol. 267, pp. 276-280) showed that pyrolysis of benzene carried out in an Ar—$H_2$ atmosphere in the presence of Ni powder affords carbon nanotubes. Each of the foregoing references is incorporated herein by reference in its entirety.

In an embodiment, the particle nucleus has the same composition as the deposited carbonaceous material formed from the carbon provided by the carbon source. In another embodiment, the particle nucleus and the deposited carbonaceous material are not identical. In an embodiment, the carbonaceous particle is a diamond particle formed from a deposited diamond material and a particle nucleus. Such diamond particles include nanodiamonds, microdiamonds, or a combination comprising at least one of the foregoing.

In an embodiment, the carbonaceous particle, after being formed, is derivatized, non-derivatized, or includes a combination of derivatized and non-derivatized particles.

In an embodiment, the nanoparticle is derivatized to include functionality for adjusting surface properties and blendability of the carbonaceous particles with a matrix (e.g., polymer, gel, solution, etc.). For example, carboxy (e.g., carboxylic acid groups), epoxy, ether, ketone, amine, hydroxy, alkoxy, alkyl, aryl, aralkyl, alkaryl, lactone, functionalized polymeric or oligomeric groups, ionic groups such as ammonium groups and/or carboxylate salt groups, or a combination comprising at least one of the foregoing functional groups. The carbonaceous particles are thus derivatized to introduce chemical functionality to the particle. For example, in an exemplary embodiment, the surface of the microdiamond or nanodiamond, or any $sp^2$ functionality or surface coating on the microdiamond or nanodiamond such as a carbon onion structure or amorphous graphitic structure, is derivatized to increase dispersibility in and interaction with a surrounding matrix (such as an aqueous slurry) to improve suspension in the matrix and uniform particle distribution in the matrix.

The carbonaceous particle has, in an embodiment, a number averaged particle size of less than or equal to 1,000 micrometers. In another embodiment, the carbonaceous particle is a microparticle of about 1 micrometer to about 1,000 micrometers, or about 1 micrometer to about 100 micrometers. In another embodiment, the carbonaceous particle is a nanoparticle having a number averaged particle size of less than about 1 micrometer. In a specific embodiment, the carbonaceous particle is a sub-micron particle of about 250 nm to less than about 1,000 nm. In another embodiment, the carbonaceous particle is a nanoparticle of about 1 nm to about 250 nm, or about 1 nm to about 100 nm. Generally, as used herein, "particle size" refers to the number averaged particle size along the longest particle dimension, and can be determined using particle size measurement methods known in the art, such as laser light scattering (static or dynamic light scattering), or direct determination methods such as scanning electron microscopy (SEM) or transmission electron microscopy (TEM).

The microparticles and/or the nanoparticles are each monodisperse or polydisperse in particle size distribution. In this way, combinations of monodisperse particles, of two or more different sizes and particle size distributions, can be used to form different distributions of particles. Different particle size distributions can be used to adjust the properties of an article formed from the carbonaceous particles, to provide, for example, improved mechanical strength and wear resistance in a solid article.

In an embodiment, a method of forming an article therefore includes depositing carbon from a carbon source, onto a particle nucleus comprising a carbon-containing material, an inorganic material, or a combination comprising at least one of the foregoing, the carbon source comprising a saturated or unsaturated $C_{1-4}$ compound. Forming the article can be by any suitable means, such as by casting of a slurry onto a surface, followed by heating and/or pressurizing such as by a standard high-pressure/high-temperature (HPHT) process, or by compounding and molding, or a combination comprising at least one of the foregoing steps. The particle so formed by depositing has a uniform particle size and particle size distribution.

In an embodiment the article is an article for downhole use. In particular, a useful article that is formed using the carbonaceous particles disclosed herein includes a polycrystalline diamond for a polycrystalline diamond compact (PDC) drill bit.

A polycrystalline diamond compact is formed by combining the carbonaceous particle, where the carbonaceous particle includes a diamond, and metal solvent-catalyst, as well as any additional nanoparticles and/or microparticles and other additives, are combined to form the polycrystalline diamond.

The solvent is any solvent suitable for forming a suspension of these components, and includes deionized water, aqueous solutions having a pH of 2 to 10, water miscible organic solvents such as alcohols including methanol, ethanol, isopropanol, n- and t-butanol, 2-methoxyethanol (methyl cellosolve), 2-ethoxyethanol (ethyl cellosolve), 1-methoxy-2-propanol, dimethylsulfoxide, N,N-dimethylformamide, N,N-dimethylacetamide, N-methylpyrrolidone, gamma-butyrolactone, acetone, cyclohexanone, and the like, or a combination comprising at least one of the foregoing.

A binder is, in an embodiment, also included in the slurry, to bind the carbonaceous particles to retain shape during further processing prior to sintering. Any suitable binder is useful provided the binder does not significantly adversely affect the desired properties of the polycrystalline diamond. Binders comprise, for example, a polymeric material such as a polyacrylate, polyvinylbutyral, or polyethylene glycol (PEG), an organic material such as a cellulosic material, or the like. It will be understood that these binders are exemplary and are not limited to these.

In an embodiment, mixing comprises slurrying the carbonaceous particles and metal solvent-catalyst to form a uniform suspension. Mixing further comprises slurrying a nanoparticle not identical to the derivatized nanodiamond, and a microparticle not identical to the microdiamond, with the other components. As used herein, "uniform" means that the composition of the slurry, analyzed at random locations in the mixing vessel, has less than 5% variation in solids content, specifically less than 2% variation in solids content, and more specifically less than 1% variation in solids content, as determined by drying a sample of the slurry. In an embodiment, the suspension has a total solids content (derivatized nanodiamond, microdiamond, and any other additives), of 0.5 wt % to 95 wt %, specifically 1 wt % to 90 wt %, more specifically 10 wt % to 80 wt %, and still more specifically 10 wt % to 50 wt %, based on the total weight of the slurry.

This suspended mixture is then heated to remove the solvent under elevated temperature. Thermally treating to remove solvent can be carried out by subjecting the mixture to a temperature of from about 400° C. to about 800° C., specifically about 450° C. to about 750° C. The thermal treating is carried out for at least about 30 minutes, more specifically at least about 60 minutes, prior to annealing. The thermal treatment is carried out under vacuum or at ambient pressure.

The polycrystalline diamond is formed by processing the polycrystalline diamond precursors (derivatized nanodiamonds, microdiamonds, optional nanoparticles and/or microparticles, and metal solvent-catalyst) under conditions of heating and pressure.

The component carbonaceous particles are sintered to form interparticle bonds and effect phase transformation of non-diamond lattice interstitial regions. Such a process is referred to herein as a "high-pressure/high-temperature (HPHT) process," in which interparticle bonds are formed between the diamond particles. Such bonds are covalent, dispersive including van der Waals, or other bonds. Specifically, the interparticle bonds include covalent carbon-carbon bonds, and in particular $sp^3$ carbon-carbon single bonds as found in a diamond lattice, sufficient to provide the hardness and fracture resistance disclosed herein. In an HPHT process, it is believed that component phases of the derivatized nanodiamond and/or microdiamond undergo a phase change to form a diamond lattice (tetrahedral carbon) structure, and in particular, any graphitic phase (such as, e.g., that of the carbon onion and or any amorphous carbon phase present in the nanodiamond or microdiamond) that are present can, in principle, undergo such a phase change and structural transformation from a delocalized $sp^2$ hybridized system (a delocalized it-system) as found in the graphitic (i.e., non-diamond) phase(s), to an $sp^3$ hybridized diamond lattice.

In addition to the nanodiamond and microdiamond, in an embodiment, nucleation particles such as those described in U.S. Patent Application Publication No. 2011/0031034 A1, incorporated herein by reference, are included in the particulate mixture. Nucleation particles comprise any type of particle on which grains of the polycrystalline diamond will nucleate and grow during an HPHT process, and include, for example, fullerenes, diamondoids, amorphous carbon nanoparticles, graphite nanoparticles, or a combination comprising at least one of the foregoing. In another embodiment, ions are also implanted into fullerene molecules, and such ion-implanted fullerenes. For example, ions of metals such as, for example, cobalt, iron, or nickel are implanted into fullerene molecules and included as nucleation particles.

In an embodiment, heating to effect sintering is carried out at a temperature of greater than or equal to about 1,000° C., and specifically greater than or equal to about 1,200° C. In an embodiment, the temperature used is from about 1,200° C. to about 1,700° C., in another embodiment from about 1,300° C. to about 1,650° C. The pressure used in processing is greater than or equal to about 5.0 gigapascals (GPa), specifically greater than or equal to about 6.0 GPa, and more specifically greater than or equal to about 6.5 GPa. Processing is carried out for 1 second to 1 hour, in an embodiment for 1 second to 10 minutes, and in another embodiment for 1 second to 2 minutes.

Thus, in an embodiment, combining further comprises sintering by subjecting the mixture to a pressure greater than about 5.0 GPa and a temperature greater than about 1,000° C., for a time of about 1 second to about 1 hour.

The composition includes a metal solvent-catalyst. As disclosed herein, the metal solvent catalyst acts to catalyze the carbon-carbon bond formation reaction. The metal solvent-catalyst catalyzes the formation of diamond-to-diamond bonds between the microdiamond and the nanodiamond and between individual nanodiamond particles to form the polycrystalline diamond. In an embodiment, the metal solvent-catalyst is a suitable transition metal and comprises Ni, Fe, Co, Cr, Ru, Os, Mn, V, alloys thereof, or a combination comprising at least one of the foregoing. In a specific embodiment, the metal solvent-catalyst is a Group VIIIA element (e.g., iron, cobalt, or nickel), an alloy thereof, or a combination comprising at least one of the foregoing. In an exemplary embodiment, the metal solvent-catalyst comprises Co, an alloy thereof, or a combination comprising at least one of the foregoing.

In additional embodiments, the catalyst material further, or alternatively, comprises a carbonate material such as, for example, a carbonate of one or more of Mg, Ca, Sr, and Ba. Carbonates are also used to catalyze the formation of polycrystalline diamond. Exemplary carbonates include magnesium carbonate, calcium carbonate, strontium carbonate, barium carbonate, or a combination comprising at least one of the foregoing. In an embodiment, a combination comprising at least one of the foregoing metals and carbonates is used.

The polycrystalline diamond prepared by the method includes the metal solvent-catalyst in an amount of about 0.1% to about 30% by weight.

A polycrystalline diamond prepared by the method is a superabrasive for use in an article such as a cutting tool, such as a drill bit for an earth-boring apparatus. As used herein, the term "drill bit" means and includes any type of bit or tool used for drilling during the formation or enlargement of a wellbore and includes, for example, rotary drill bits, percussion bits, core bits, eccentric bits, bicenter bits, reamers, expandable reamers, mills, drag bits, roller cone bits, hybrid bits and other drilling bits and tools known in the art.

In an embodiment, a method of making a superabrasive article (e.g., a drill bit), comprises forming a superabrasive polycrystalline diamond compact in an HPHT process by combining a nanodiamond derivatized to include functional groups, a microdiamond, and a metal solvent-catalyst; combining the polycrystalline diamond with a support, wherein the microdiamond has an average particle size greater than that of the derivatized nanodiamond; and removing the metal solvent-catalyst.

The polycrystalline diamond surface is affixed to a substrate to form a polycrystalline diamond compact (PDC), which, in turn, is attached to a support such as a drill head. The substrate is a ceramic material. Polycrystalline diamond integrated onto such a substrate is also referred to as a diamond table. In an embodiment, polycrystalline diamond is formed on a supporting substrate of cemented tungsten carbide or another suitable substrate material in a conventional HPHT process as described, for example, in U.S. Pat. No. 3,745,623, or is formed as a free-standing polycrystalline diamond compact without a supporting substrate, formed in a similar conventional HPHT process as described, for example, in U.S. Pat. No. 5,127,923, or formed by an imbibing process as described in International Patent Application Publication No. WO/2010/045257A1, the disclosure of each of which is incorporated herein by reference in its entirety. In an embodiment, the metal solvent-catalyst is supplied from the supporting substrate during an HPHT process used to form the polycrystalline diamond. For example, the substrate includes a cobalt-cemented tungsten carbide material. The cobalt of the cobalt-cemented tungsten carbide serves as the metal solvent-catalyst during the HPHT process.

In an embodiment, a method of making a polycrystalline diamond compact comprises heating and pressure treating, in the presence of a metal catalyst, a diamond table comprising nanodiamonds, microdiamonds, or a combination comprising at least one of the foregoing, the nanodiamonds and/or microdiamonds being formed by depositing carbon from a carbon source onto a particle nucleus comprising a carbon-containing material, an inorganic material, or a combination comprising at least one of the foregoing, the carbon source comprising a saturated or unsaturated compound of $C_{20}$ or less, the nanodiamonds and/or microdiamonds so formed by depositing having a uniform particle size and particle size distribution. In an embodiment, the particle nucleus comprises diamond, diamond-like carbon, carbon black, graphite, graphene, nanotubes, or a combination comprising at least one of the foregoing, and the carbonaceous particle is a diamond particle.

While one or more embodiments have been shown and described, modifications and substitutions may be made thereto without departing from the spirit and scope of the invention. Accordingly, it is to be understood that the present invention has been described by way of example and not limitation.

All ranges disclosed herein are inclusive of the endpoints, and the endpoints are independently combinable with each other. The suffix "(s)" as used herein is intended to include both the singular and the plural of the term that it modifies, thereby including at least one of that term (e.g., the colorant(s) includes at least one colorant). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like. All references are incorporated herein by reference.

The use of the terms "a" and "an" and "the" and similar referents in the context of describing the invention (especially in the context of the appended claims) are to be construed to cover both the singular and the plural, unless otherwise indicated herein or clearly contradicted by context. Further, it should further be noted that the terms "first," "second," and the like, herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A method of forming a polycrystalline diamond compact, the method comprising:
    pyrolyzing a carbon source to deposit from the carbon source onto a plurality of particle nuclei to form a plurality of particles having a number-averaged particle size of greater than or equal to 125 nm and less than or equal to about 1,000 micrometers, the particle nuclei comprising at least one material selected from the group consisting of a carbon-containing material and an inorganic material, the carbon source comprising a saturated or unsaturated compound of $C_{20}$ or less;
    wherein the pyrolyzing is performed in the presence of a gas selected from the group consisting of hydrogen, an inert gas, and combinations thereof;
    mixing the plurality of particles with a solvent to form a suspension comprising the particles of the plurality dispersed in the solvent;
    removing the solvent to form a dried volume of particles including carbon from the saturated or unsaturated compound of $C_{20}$ or less; and
    increasing a pressure and a temperature of the dried volume of particles to form interparticle bonds between adjacent particles of the plurality of particles.

2. The method of claim 1, wherein the particle nuclei are derivatized, underivatized, or a combination of derivatized and underivatized, and wherein the particle nuclei comprise at least one of diamond, diamond-like carbon, carbon black, graphite, graphene, and nanotubes.

3. The method of claim 2, wherein the particle nuclei comprise at least one material selected from the group consising of nanodiamond and microdiamond.

4. The method of claim 1, wherein pyrolyzing a carbon source to deposit carbon from the carbon source onto a plurality of particle nuclei comprises forming particles having a number-averaged particle size of about 1 to about 1,000 micrometers.

5. The method of claim 1, wherein the carbon source comprises a metallocene.

6. The method of claim 1, wherein pyrolyzing a carbon source to deposit carbon from the carbon source onto a plurality of particle nuclei comprises forming at least one material selected from the group consisting of particles having a spherical shape, particles having a worm-like carbon structure, carbon nanofibers, carbon nano-coils, and carbon micro-coils.

7. The method of claim 1, wherein pyrolyzing a carbon source to deposit carbon from the carbon source onto a plurality of particle nuclei comprises forming diamond.

8. The method of claim 1, wherein increasing a pressure and a temperature of the dried volume of particles to form interparticle bonds between adjacent particles of the plurality of particles comprises increasing the pressure of the dried volume of particles to at least about 5.0 GPa and increasing the temperature of the dried volume of particles to at least about 1,000° C.

9. The method of claim 1, wherein pyrolyzing a carbon source to deposit carbon from the carbon source onto a plurality of particle nuclei comprises forming particles having a monodisperse or polydisperse particle size distribution.

10. A method of forming a polycrystalline diamond compact, the method comprising:
    pyrolyzing a carbon source to deposit carbon from the carbon source onto a plurality of particle nuclei to form a plurality of particles having a number-averaged particle size of greater than or equal to 125 nm and less than or equal to about 1,000 micrometers, the particle nuclei comprising at least one material selected from the group consisting of carbon nanotubes, inorganic nanotubes, and metallated nanotubes, Wherein the particle nuclei are derivatized, underivatized, or a combination of derivatized and underivatized, the carbon source comprising a saturated or unsaturated compound of $C_{20}$ or less, wherein the pyrolyzing is performed in the presence of a gas selected from the group consisting of hydrogen, an inert gas, and combinations thereof;
    mixing the plurality of particles with a solvent to form a suspension comprising the particles of the plurality dispersed in the solvent;

removing the solvent to form a dried volume of particles including carbon from the saturated or unsaturated compound of $C_{20}$ or less; and increasing a pressure and a temperature of the dried volume of particles to form interparticle bonds between adjacent particles of the plurality of particles.

11. The method of claim 10, wherein increasing a pressure and a temperature of the dried volume of particles to form interparticle bonds between adjacent particles of the plurality of particles comprises increasing the pressure of the dried volume of particles to at least about 5.0 GPa and increasing the temperature of the dried volume of particles to at least about 1,000° C.

12. The method of claim 10, wherein pyrolyzing a carbon source to deposit carbon from the carbon source onto a plurality of particle nuclei comprises forming particles having a monodisperse or polydisperse particle size distribution.

13. A method of forming a polycrystalline diamond compact, the method comprising:

pyrolyzing a carbon source to deposit carbon from the carbon source onto a plurality of particle nuclei to form a plurality of particles having a number-averaged particle size of greater than or equal to 125 nm and less than or equal to about 1,000 micrometers, the particle nuclei comprising at least one material selected from the group consisting of single- walled and multi-walled nanotubes, Wherein the particle nuclei are derivatized, underivatized, or a combination of derivatized and underivatized, the carbon source comprising a saturated or unsaturated compound of $C_{20}$ or less, Wherein the pyrolyzing is performed in the presence of a gas selected from the group consisting of hydrogen, an inert gas, and combinations thereof;

mixing the plurality of particles with a solvent to form a suspension comprising the particles of the plurality dispersed in the solvent;

removing the solvent to form a dried volume of particles including carbon from the saturated or unsaturated compound of $C_{20}$ or less; and increasing a pressure and a temperature of the dried volume of particles to form interparticle bonds between adjacent particles of the plurality of particles.

14. The method of claim 13, wherein increasing a pressure and a temperature of the dried volume of particles to form interparticle bonds between adjacent particles of the plurality of particles comprises increasing the pressure of the dried volume of particles to at least about 5.0 GPa and increasing the temperature of the dried volume of particles to at least about 1,000° C.

15. The method of claim 13, wherein pyrolyzing a carbon source to deposit carbon from the carbon source onto a plurality of particle nuclei comprises forming particles having a monodisperse or polydisperse particle size distribution.

* * * * *

UNITED STATES PATENT AND TRADEMARK OFFICE
CERTIFICATE OF CORRECTION

PATENT NO. : 10,005,672 B2
APPLICATION NO. : 13/316094
DATED : June 26, 2018
INVENTOR(S) : Oleg A. Mazyar et al.

Page 1 of 2

It is certified that error appears in the above-identified patent and that said Letters Patent is hereby corrected as shown below:

On the Title Page
After ITEM (65) and before ITEM (51)
On the next line insert heading --Related U.S. Application Data--
insert --Continuation-in-part of application No. 13/084,003, filed on Apr. 11, 2011, now Pat. No. 8,974,562, issued Mar. 10, 2015, which is a continuation-in-part of application No. 13/077,426, filed on Mar. 31, 2011, now Pat. No. 9,776,151, issued Oct. 3, 2017, which claims priority from provisional application 61/324,142, filed Apr. 14, 2010.--

In the Specification

Column 1, Line 14, insert --This application is also related to U.S. Provisional Patent Application No. 61/535,470, filed September 16, 2011, for "Use of Hydrocarbon Gases to Promote Diamond Intergrowth in Polycrystalline Diamond Material," and U.S. Provisional Patent Application No. 61/535,475, filed September 16, 2011, for "Functionalized Carbon-Free Particles for Improved Sintering of Polycrystalline Diamond."--

Column 4, Line 37, change "supersonic arcject" to --supersonic arcjet--
Column 7, Line 34, change "it-system)" to --π-system)--

In the Claims
Claim 1, Column 9, Line 56, change "deposit from" to --deposit carbon from--
Claim 1, Column 9, Line 64, change "unsaturated compound" to --unsaturated organometallic compound--
Claim 1, Column 9, Line 64, change "or less;" to --or less,--

Signed and Sealed this
Twelfth Day of March, 2019

Andrei Iancu
*Director of the United States Patent and Trademark Office*

CERTIFICATE OF CORRECTION (continued)
U.S. Pat. No. 10,005,672 B2

| | | | |
|---|---|---|---|
| Claim 2, | Column 10, | Line 13, | change "least one of diamond," to --least one material selected from the group consisting of diamond,-- |
| Claim 3, | Column 10, | Line 17, | change "consising of" to --consisting of-- |
| Claim 10, | Column 10, | Line 57, | change "nanotubes, Wherein" to --nanotubes, wherein-- |
| Claim 13, | Column 11, | Line 27, | change "nanotubes, Wherein" to --nanotubes, wherein-- |
| Claim 13, | Column 12, | Line 3, | change "or less, Wherein" to --or less, wherein-- |